United States Patent
Visokay

(10) Patent No.: US 7,767,511 B2
(45) Date of Patent: Aug. 3, 2010

(54) SEMICONDUCTOR DEVICE MANUFACTURED USING A METHOD TO IMPROVE GATE DOPING WHILE MAINTAINING GOOD GATE PROFILE

(75) Inventor: Mark R. Visokay, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 230 days.

(21) Appl. No.: 11/766,191

(22) Filed: Jun. 21, 2007

(65) Prior Publication Data

US 2008/0318376 A1 Dec. 25, 2008

(51) Int. Cl.
*H01L 21/8238* (2006.01)
(52) U.S. Cl. .................. 438/199; 438/142; 438/233; 257/E21.632; 257/E29.255
(58) Field of Classification Search .............. 438/199, 438/142, 233; 257/377, E21.632, E21.202, 257/E21.203, E29.255, 369, 350
See application file for complete search history.

(56) References Cited

U.S. PATENT DOCUMENTS

2005/0194642 A1* 9/2005 Kamiya et al. .............. 257/350
2007/0278587 A1* 12/2007 Aoyama et al. ............. 257/369

* cited by examiner

*Primary Examiner*—Alexander G Ghyka
*Assistant Examiner*—Abdulfattah Mustapha
(74) *Attorney, Agent, or Firm*—Warren L. Franz; Wade J. Brady, III; Frederick J. Telecky, Jr.

(57) ABSTRACT

In one aspect, there is provided a method of manufacturing a semiconductor device. This method includes forming gate structures over a substrate, wherein the gate structures include gate electrodes located adjacent source/drain regions. A protective layer is formed over the gate structures and a CMP layer is formed over the protective layer. A portion of the CMP layer and the protective layer is removed to expose a portion of the gate electrodes with remaining portions of the CMP layer and the protective layer remaining over the source/drain regions. The exposed portions of the gate electrodes are doped with an n-type dopant or a p-type dopant, and the remaining portions of the CMP layer and the protective layer located over the source/drain regions are removed subsequent to the doping.

14 Claims, 16 Drawing Sheets

US 7,767,511 B2

SEMICONDUCTOR DEVICE MANUFACTURED USING A METHOD TO IMPROVE GATE DOPING WHILE MAINTAINING GOOD GATE PROFILE

TECHNICAL FIELD OF THE INVENTION

The invention is directed, in general, to forming MOS transistors, and, more specifically, to improving gate doping while maintaining good gate profile.

BACKGROUND OF THE INVENTION

Semiconductor devices, such as transistors, have reached well into the sub-micron range, e.g., below 0.25 microns. The semiconductor manufacturing industry has made continued advances in overall device speed and performance, while continually shrinking device size and increasing component density.

Transistors that comprise a bulk of these devices are manufactured using well-known processing methods. These processing methods are used to manufacture the very small gate dimensions that are now prevalent in the industry. In many designs these small gates are formed as complementary NMOS (n-channel) and PMOS (p-channel) transistors. One way in which these gates are manufactured is by first depositing a layer of polysilicon across a semiconductor wafer and then masking off either the NMOS or PMOS areas and doping the unmasked regions with the appropriate dopant. These doping steps are followed by a lithographic process that patterns the doped polysilicon layer into NMOS and PMOS gate electrodes, after which their respective source/drains are then ultimately formed.

Another way in which these gate structures are formed is by depositing a polysilicon layer across the semiconductor wafer and then using lithographic processes to pattern the layer into individual gate electrodes, which are then doped when the source/drain regions are doped, thus the gate electrodes receives essentially the same dosage as the source/drains.

SUMMARY OF THE INVENTION

The invention provides in one embodiment a method of manufacturing a semiconductor device. This embodiment includes forming NMOS and PMOS transistors located over a substrate. The NMOS and PMOS transistors respectively include NMOS gate electrodes and NMOS source/drains and PMOS gate electrodes and PMOS source/drains. These structures are formed by the process of forming a protective layer over the NMOS and PMOS source/drains and the NMOS and PMOS gate structures and over an oxide cap layer. A CMP layer is formed over the protective layer, and the method further includes removing a portion of the CMP layer, the protective layer, and the oxide cap layer to expose a portion of the NMOS and PMOS gate electrodes. Portions of the CMP layer, the protective layer, and the oxide cap layer remain over the NMOS and PMOS source/drains. A mask is patterned over the PMOS gate electrodes to leave the NMOS gate electrodes exposed and the exposed NMOS gate electrodes are doped with an n-type dopant. A mask is patterned over the NMOS gate electrodes to leave the PMOS gate electrodes exposed, and the PMOS gate electrodes are doped with a p-type dopant. A source/drain anneal is conducted subsequent to doping the NMOS and PMOS gate electrodes, and remaining portions of the CMP layer, the protective layer, and the oxide cap layer located over the source/drains are removed subsequent to doping the NMOS and PMOS gate electrodes. A plurality of dielectric layers are formed over the substrate with horizontal and vertical interconnects located therein.

Another embodiment provides another method of manufacturing a semiconductor device. This embodiment includes forming gate structures over a substrate, wherein the gate structures include gate electrodes located adjacent source/drain regions. A protective layer is formed over the gate structures and a CMP layer is formed over the protective layer. A portion of the CMP layer and the protective layer is removed to expose a portion of the gate electrodes with remaining portions of the CMP layer and the protective layer remaining over the source/drain regions. The exposed portion of the gate electrodes are doped with an n-type dopant or a p-type dopant, and the remaining portions of the CMP layer and the protective layer located over the source/drain regions are removed subsequent to the doping.

Another embodiment provides a semiconductor device. The device includes a plurality of dielectric layers located over a substrate with horizontal and vertical interconnects formed therein. It also includes NMOS and PMOS transistors located over a substrate, the NMOS and PMOS transistors respectively including NMOS gate electrodes and NMOS source/drains and PMOS gate electrodes and PMOS source/drains. These structures are formed by the process of forming a protective layer over the NMOS and PMOS source/drains and the NMOS and PMOS gate structures and over an oxide cap layer. A CMP layer is formed over the protective layer, and the method further includes removing a portion of the CMP layer, the protective layer, and the oxide cap layer to expose a portion of the NMOS and PMOS gate electrodes. Portions of the CMP layer, the protective layer, and the oxide cap layer remain over the NMOS and PMOS source/drains. A mask is patterned over the PMOS gate electrodes to leave the NMOS gate electrodes exposed and the exposed NMOS gate electrodes are doped with an n-type dopant. A mask is patterned over the NMOS gate electrodes to leave the PMOS gate electrodes exposed, and the PMOS gate electrodes are doped with a p-type dopant. A source/drain anneal is conducted subsequent to doping the NMOS and PMOS gate electrodes, and remaining portions of the CMP layer, the protective layer, and the oxide cap layer located over the source/drains are removed subsequent to doping the NMOS and PMOS gate electrodes.

BRIEF DESCRIPTION OF THE DRAWINGS

The disclosure is described with reference to example embodiments and to accompanying drawings, wherein.

DETAILED DESCRIPTION

Figure 1:
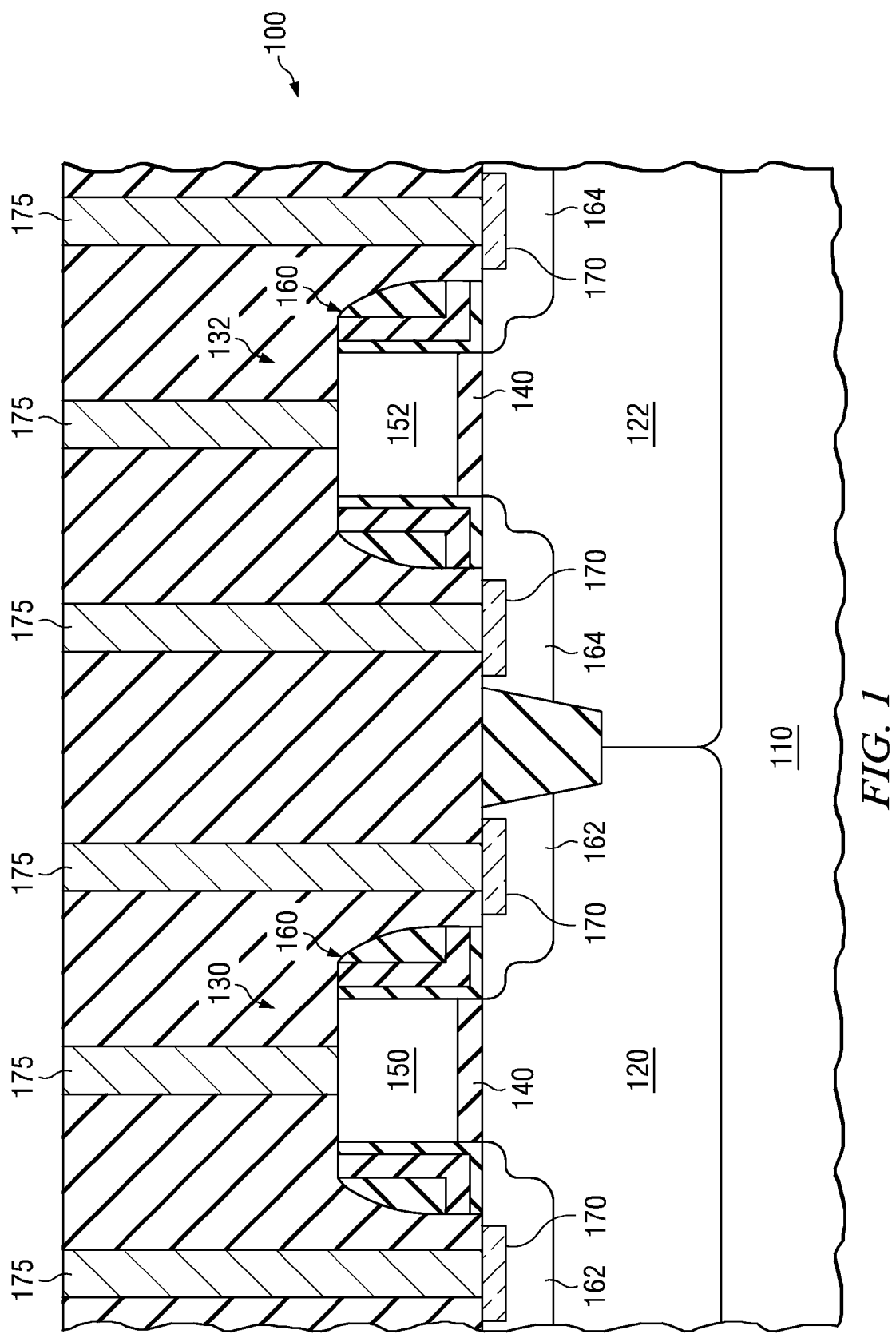
FIG. 1 illustrates a semiconductor device that may be constructed in accordance with the invention.

FIG. 1 illustrates a view of one embodiment of a semiconductor device 100 that may be made by the various embodiments of the invention. The semiconductor device 100 includes a substrate 110. The substrate 110 may be any known semiconductor material and may be any layer deposited over a semiconductor wafer, such as an epitaxial layer or may be a doped region of a semiconductor wafer. Located within the substrate 110 are well regions 120, 122. In one embodiment, these wells may be complementary wells; for example, well 120 may be a well for an NMOS device and well 122 may be a well for a PMOS device. Located over the substrate 110 and well regions 120, 122 are gate structures 130, 132, which in one embodiment, may be a complementary device; for example, gate structure 130 may be an NMOS device and gate structure 132 may be a PMOS device.

The gate structures 130, 132 illustrated in FIG. 1 each include a gate oxide 140 located over the substrate 110, as well as doped gate electrodes 150, 152 located over the gate oxide 140. The gate electrodes 150, 152 may have a variety of thicknesses, for example, a thickness ranging from about 50 nm to about 150 nm is exemplary. In one embodiment, the gate electrodes 150, 152 may comprise an appropriately doped polysilicon that can function as either an NMOS or PMOS device. For example, the gate electrodes 150, 152 may include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so-called work function.

The gate structures 130, 132 may further include conventional gate sidewall spacers 160 flanking both sides of the gate electrodes 150, 152. The gate sidewall spacers 160 in the embodiment of FIG. 1 may each include one or more different layers. For instance, the gate sidewall spacers 160 may also include nitride spacers and sidewall oxides. The gate sidewall spacers 160 may comprise many different types and numbers of layers.

The semiconductor device 100 illustrated in FIG. 1 additionally includes conventional source/drain regions 162, 164 located within the substrate 110 and proximate the gate electrodes 150, 152. The source/drains 162, 164 may or may not include extensions and are doped with a dopant to correspond to the type of device. For instance, source/drains 162, may be doped with an n-type dopant, such as arsenic or phosphorous, while source/drains 164 may be doped with a p-type dopant, such as boron. Located within the source/drains 162, 164 are silicided source/drain contact pads 170, on which contact structures 175 are located. The silicided source/drain contact pads 170, in one embodiment, may comprise nickel silicided source/drain contact pads. Nonetheless, other silicidation materials could be used to form the silicided source/drain contact pads 170. The silicided source/drain contact pads 170 may have a depth into the source/drains 162, 164 ranging from about 10 nm to about 30 nm, among others.

FIGS. 2A-6 illustrate selected manufacturing steps instructing how one might, in certain embodiments, manufacture the semiconductor device 100 depicted in FIG. 1. The partially completed semiconductor device 200 of FIG. 2A includes a substrate 210. As mentioned above, the substrate 210 may be any layer located in the partially completed semiconductor device 200, including the semiconductor wafer itself or a layer located above the wafer (e.g., epitaxial layer). In the embodiment illustrated in FIG. 2A, the substrate 210 is a p-type substrate; however, one skilled in the art understands that the substrate 210 could be an n-type substrate. In such cases, each of the dopant types described throughout the remainder of this document would be reversed. For ease of discussion, no further reference to this opposite scheme will be discussed.

Located within the substrate 210 are conventionally doped wells 220, 222. In one doping scheme, the well region 220 may be doped with a p-type dopant, such as boron, to form the basis of an NMOS or n-channel device, while well region 222 may be doped with an n-type dopant, such as arsenic or phosphorous, to form the basis for a PMOS or p-channel device.

Figure 2A:
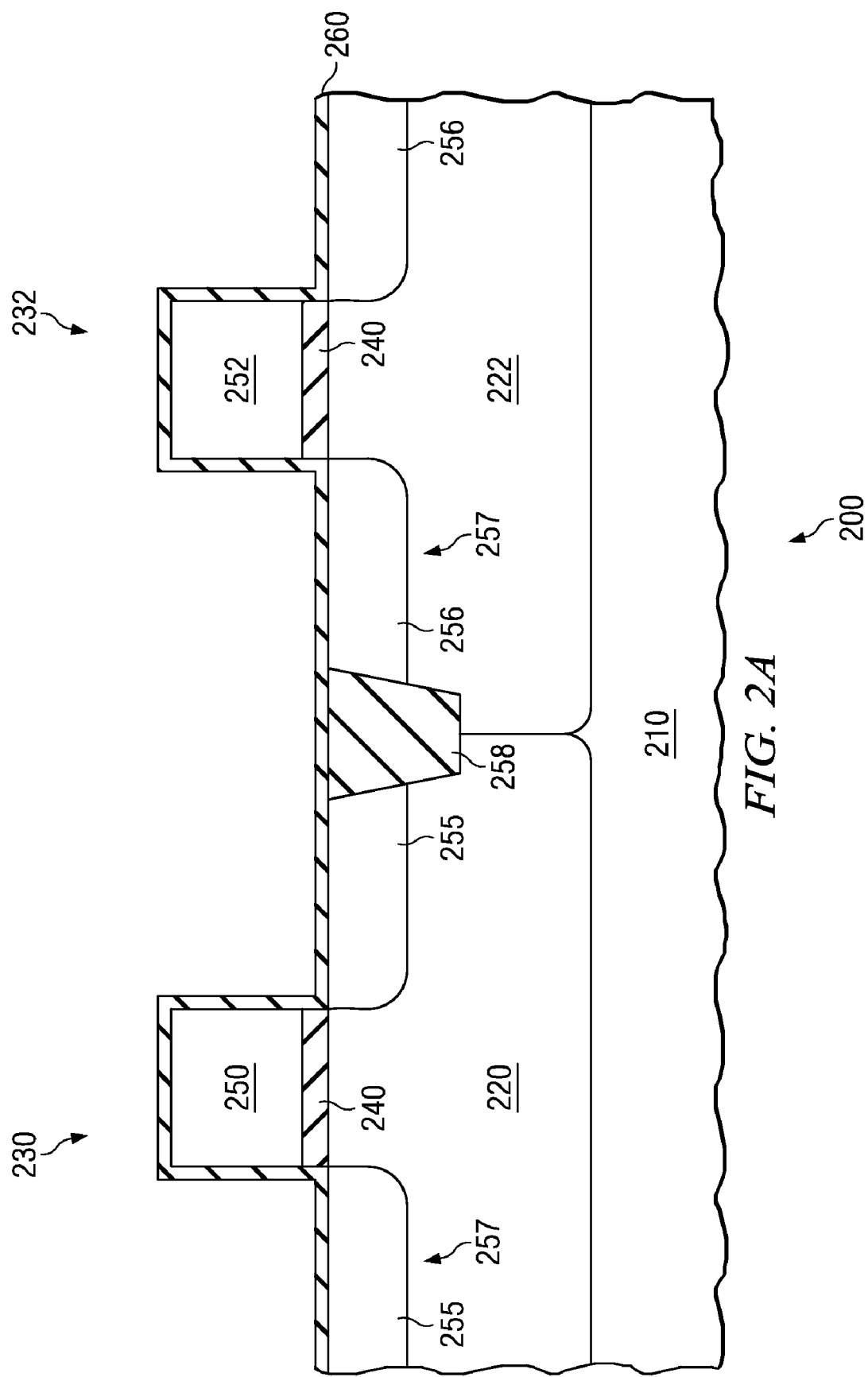
FIGS. 2A-2E illustrate the semiconductor device of FIG. 1 at different stages of manufacture.

Located over the substrate 210 in the embodiment of FIG. 2A are conventionally formed gate structures 230, 232. It should be noted that at this point of manufacture and unlike certain conventional processes, the gate structures 230, 232 are not operatively doped but are doped at a later point in time, as explained below. This provides the benefit of reducing bias or differences in gate lengths between PMOS gate electrodes and NMOS gate electrodes that can occur during the patterning of the gate electrodes when the gate material is doped before patterning. Since the gate material layer is not doped, the pattern etch is conducted on the same type of material regardless of whether it will ultimately form a PMOS or NMOS device. Thus, etching differentials, which can cause gate length differences after etch, are not present.

In the illustrated embodiment, the gate structures 230, 232 each include a gate oxide 240 and a polysilicon gate electrode 250, 252. The gate oxide 240 may comprise a number of different materials and stay within the scope of the present invention. For example, the gate oxide 240 may comprise silicon dioxide, or in an alternative embodiment comprise a high dielectric constant (K) material. In the embodiment of FIG. 2A, however, the gate oxide 240 is a silicon dioxide layer having a thickness ranging from about 0.5 nm to about 5 nm.

The polysilicon gate electrodes 250, 252 may comprise standard polysilicon. However, in other embodiments, the polysilicon gate electrodes 250, 252, or at least a portion thereof, may comprise amorphous polysilicon. The amorphous polysilicon embodiment may be particularly useful when a substantially planar upper surface of the polysilicon gate electrode 250, 252 is desired.

The deposition conditions for the polysilicon gate electrodes 250, 252 may vary. However, if the polysilicon gate electrodes 250, 252 were to comprise standard polysilicon, the polysilicon gate electrodes 250, 252 could be deposited using a pressure ranging from about 100 torr to about 300 torr. A process temperature ranging from about 620° C. to about 700° C., and a $SiH_4$ or $Si_2H_6$ gas flow ranging from about 50 sccm to about 150 sccm may be used. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrodes 250, 252 desirably have a thickness ranging from about 50 nm to about 150 nm, and in one embodiment, the thickness is about 80 nm. Conventional blanket deposition and patterning processes may be used to form the gate electrodes 250, 252 and gate oxides 240.

Following the patterning of the gate electrodes 250, 252 and gate oxides 240, source/drain extensions 255, 256, which may be medium doped drains (MDD) or lightly doped drains (LLD), may be conventionally formed in source/drain regions 257 adjacent the gate electrodes 250, 252. Extensions 255, 256 are optional and may or may not be present in certain embodiments. These lightly doped regions form an extension of later formed source/drains. The extensions 255, 256 may be conventionally formed. For example, in one embodiment, they may have a peak dopant concentration ranging from about 1E19 atoms/cm$^3$ to about 2E20 atoms/cm$^3$. As is standard in the industry, the extensions 255, 256 have a dopant type opposite to that of the well region 220, 222 in which they are located and are more lightly doped than later formed source/drains, as discussed below. An isolation structure 258, such as a conventional trench isolation structure, is located between the source/drain extensions 255, 256.

The semiconductor device 200 illustrated in FIG. 2A further includes a pad oxide layer 260 located over the gate electrodes 250, 252. The oxide layer 260 may be formed after the optional extensions 255, 256 are formed. Conventional processes, such as chemical vapor deposition, may also be used to form the pad oxide layer 260 over the gate electrodes 250, 252. In certain embodiments, it forms a portion of a sidewall spacer, as discussed below. The thickness of the pad oxide layer 260 may vary.

Figure 2B:
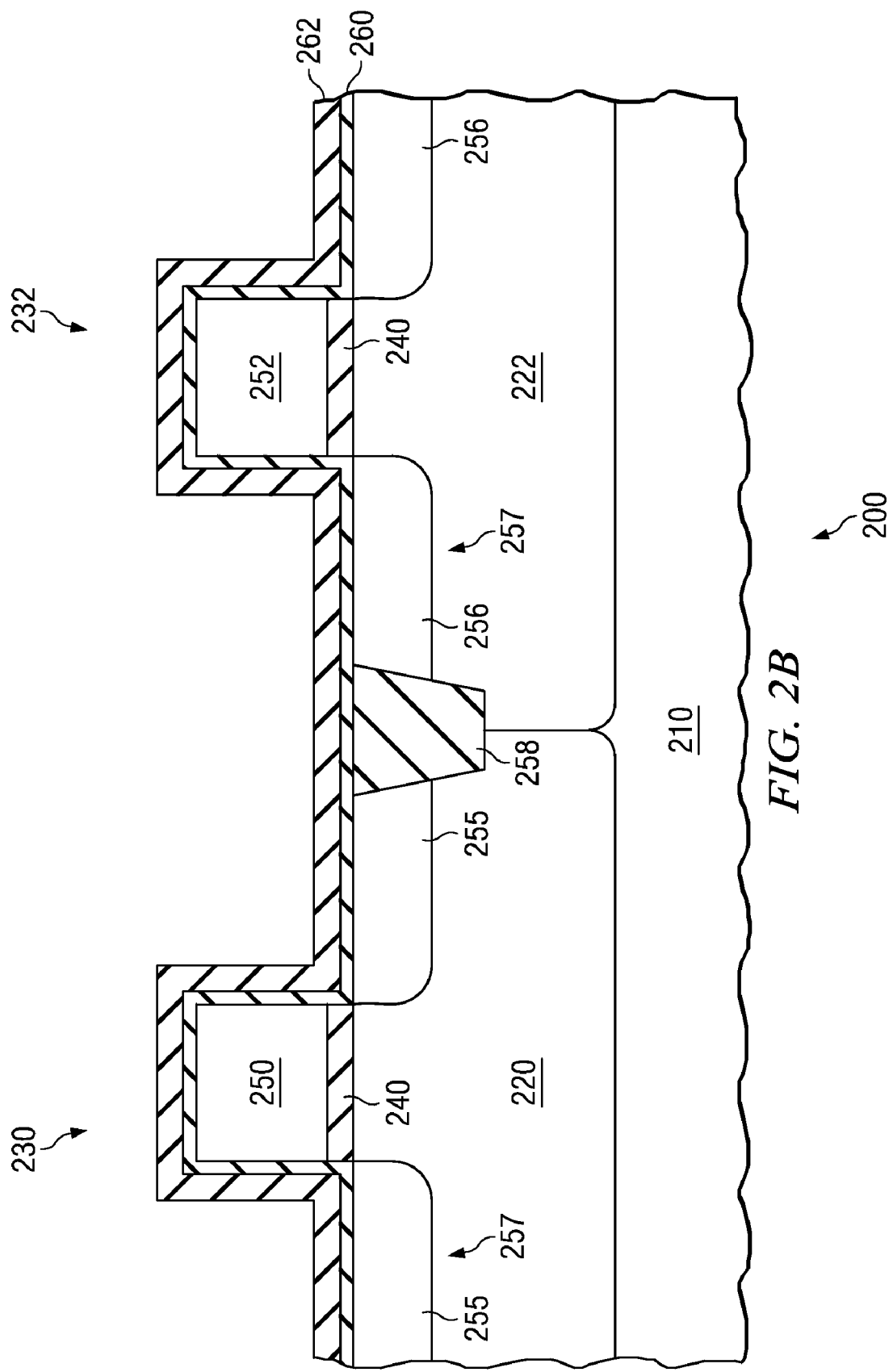

FIG. 2B illustrates the semiconductor device 200 of FIG. 2A after deposition of a nitride layer 262. Conventional processes may be used to deposit the nitride layer 262, and it may comprise a standard silicon nitride or a silicon nitride layer having carbon therein. If the nitride layer 262 were to contain the carbon, the carbon might form from about 5% to about 10% of the layer. The thickness of the nitride layer 262 may also vary, depending on design. In one embodiment, the nitride layer 262 may have a thickness of about 80 nm and is deposited using a silane and nitrogen gas mixture. The nitride layer 262 is ultimately etched to form a sidewall spacer on each side of the gate electrodes 250, 252, as discussed below.

Figure 2C:
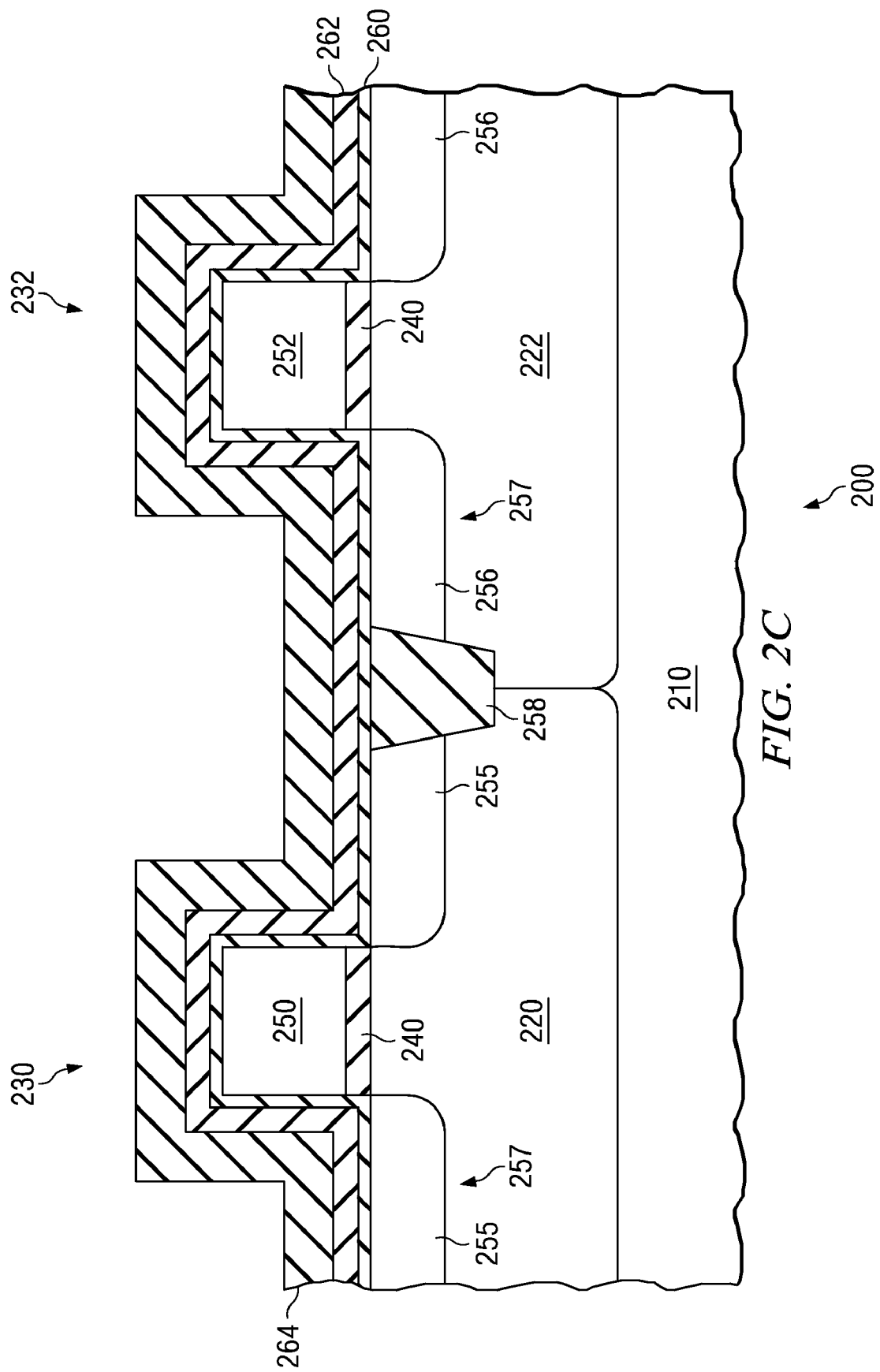

FIG. 2C illustrates the semiconductor device 200 of FIG. 2B after the deposition of an oxide layer 264. The oxide layer 264 may be conventionally deposited over the nitride layer 262, and its thickness may range from about 100 nm to about 150 nm. While only three different layers have been illustrated and discussed in the foregoing embodiments, it should be understood that the number of layers may vary, and certain embodiments, may include only one or two layers, or more than three layers. Moreover, it should be understood that any one or more of the layers may form a spacer material that can be etched to form sidewall spacers for the gate electrodes 250, 252.

Figure 2D:
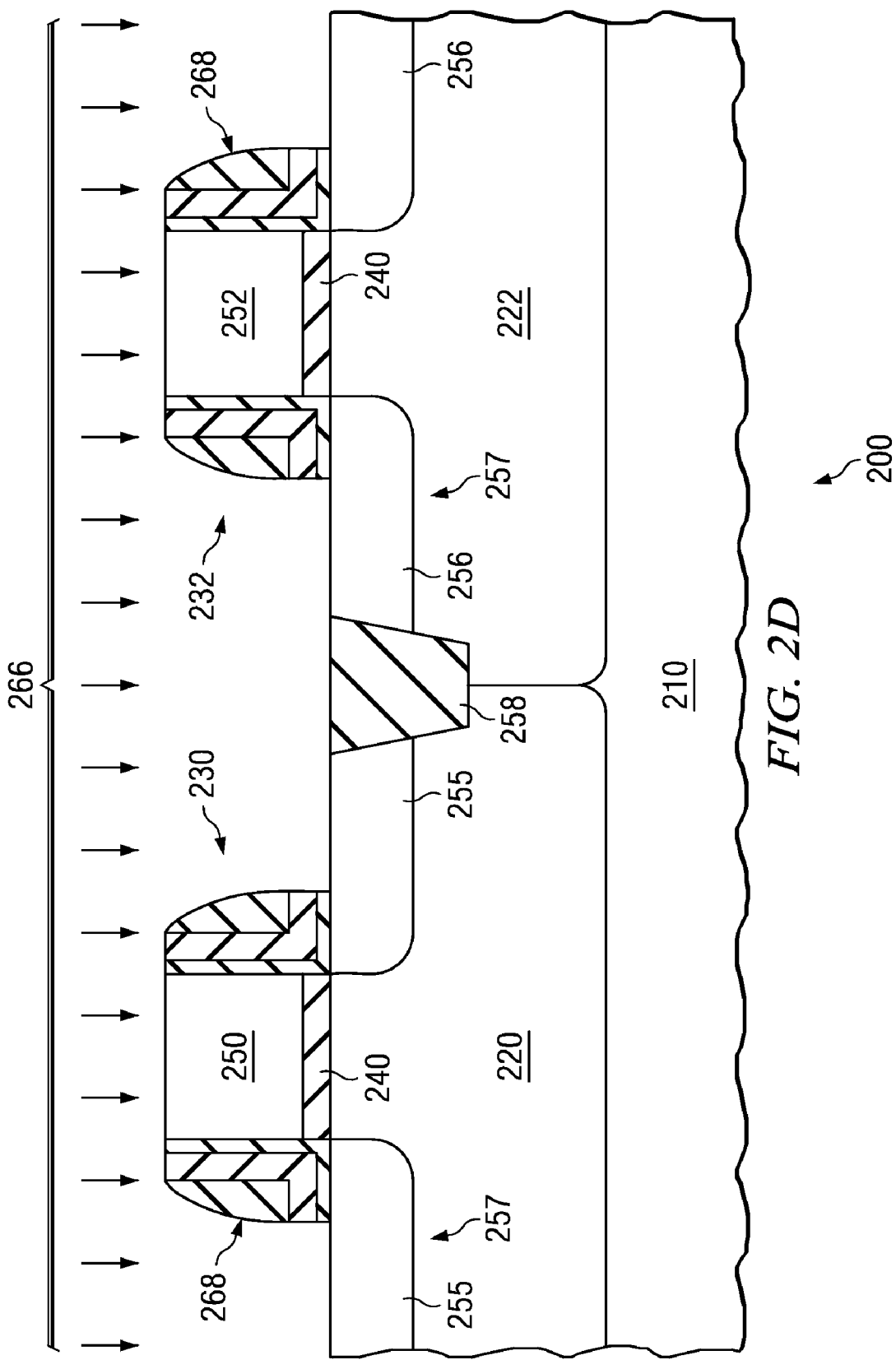

FIG. 2D illustrates the semiconductor device 200 of FIG. 2C following a sidewall etch process 266. The sidewall etch 266 may be conventional and conducted with a conventional anisotropic etch to remove lateral portions of the oxide layers 260 and 264, and nitride layer 262 and form the L-shaped sidewall spacers 268 shown in FIG. 2D.

Figure 2E:
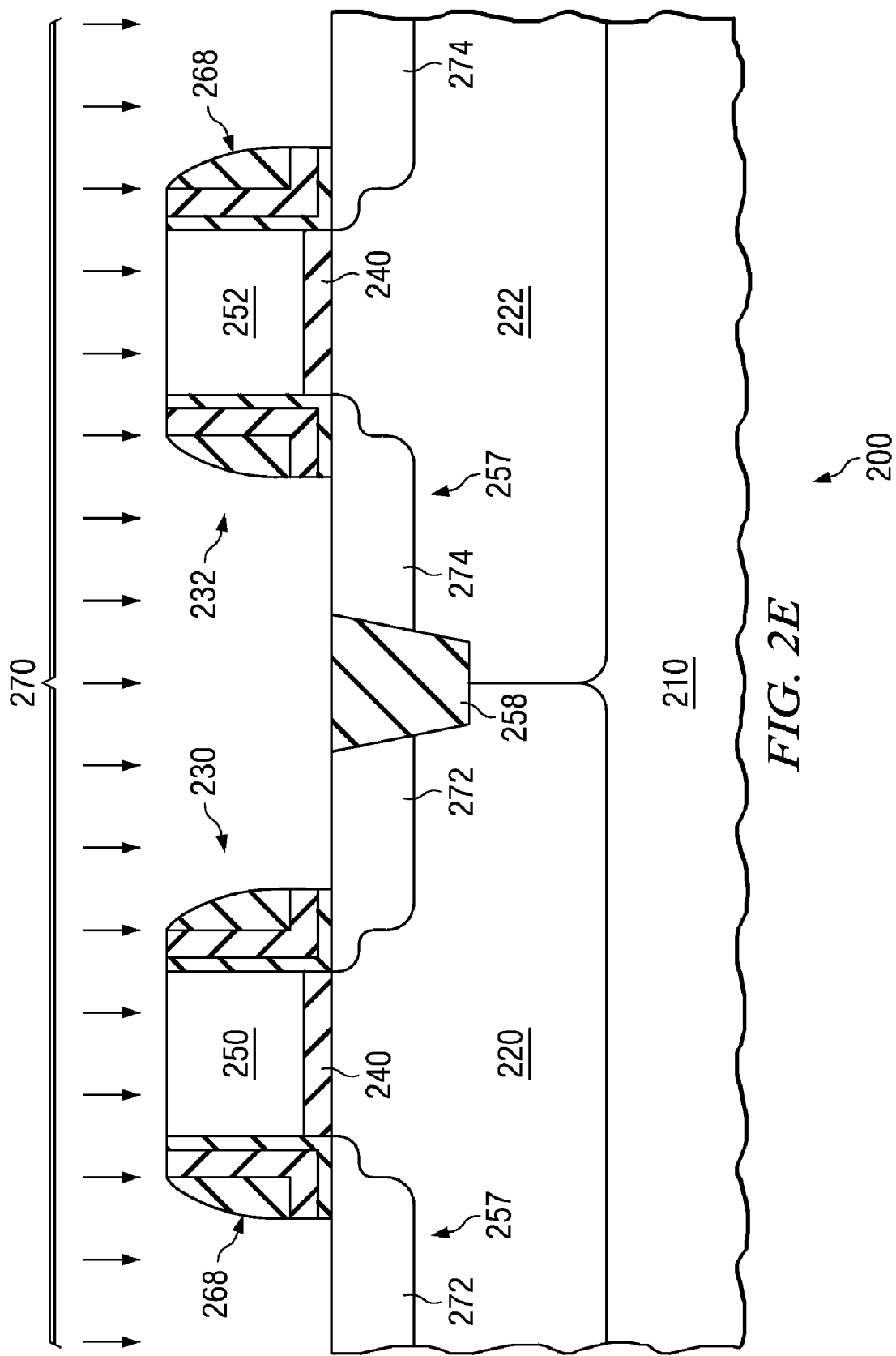

In one embodiment, the formation of the sidewall spacers 262 may be followed by a conventional source/drain implant 270 as shown in FIG. 2E, which forms source/drains 272, 274 adjacent each of the gate electrodes 250, 252. As mentioned above, the source/drains 272, 274 may have a greater dopant concentration than the source/drain extensions 255, 256. However, in another embodiment, the formation of the source/drains 272, 274 may be conducted at a later point in time and after the doping of the gate electrodes 250, 252, as explained below. If the source/drains 272, 274 are formed prior to the doping of the gate electrodes 250, 252, in one embodiment, the activation anneal that activates the dopant in both the source/drains 272, 274 and the extensions 255, 256 is conducted after the doping of the gate electrodes 250, 252. In another embodiment, the activation anneal may occur before the doping of the gate electrodes 250, 252.

When conducted, the source/drain implant 270 may involve a high dopant concentration that has a peak dopant concentration. For example, the peak dopant concentration may range from about 1E18 atoms/cm$^3$ to about 1E21 atoms/cm$^3$. This range is given as an example only, and it should be understood that other concentrations may be used, depending on the design and function of the device 200. Also, the highly doped source/drain implant 270 will typically have a dopant type opposite to that of the well region 220, 222 in which it is implanted.

Figure 3A:
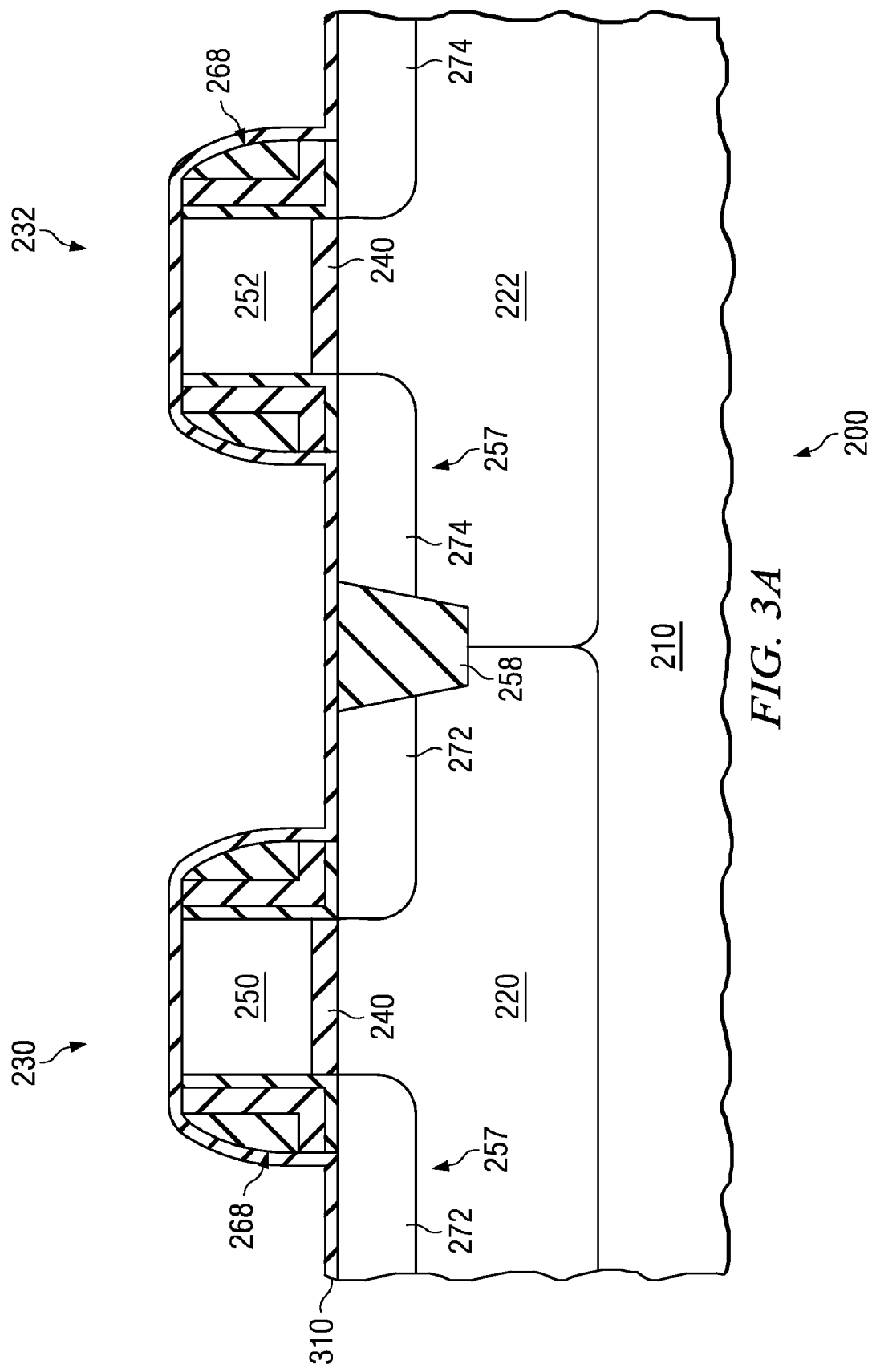
FIGS. 3A-3C illustrate the semiconductor device of FIG. 2E after formation of a cap layer, a protective layer and a CMP layer.

FIG. 3A illustrates the semiconductor device 200 of FIG. 2E following the deposition of an oxide capping layer 310. The capping layer 310 is preferably silicon dioxide. Conventional deposition processes, such as chemical vapor deposition or chemical vapor deposition may be used to deposit the cap layer 310. The thickness of the cap layer 310 may range from about 0.2 nm to about 1 nm. As shown in the embodiment of FIG. 3A, the capping layer 310 is conformally deposited over both gate structures 230, 232 and the source/drains 272, 274. The capping layer 310 helps to protect the source/drains 272, 274 during a gate dopant implant process, and it also serves to provide a controlled etch that exposes the top portions of the gate electrodes 250, 252 to those processes.

Figure 3B:
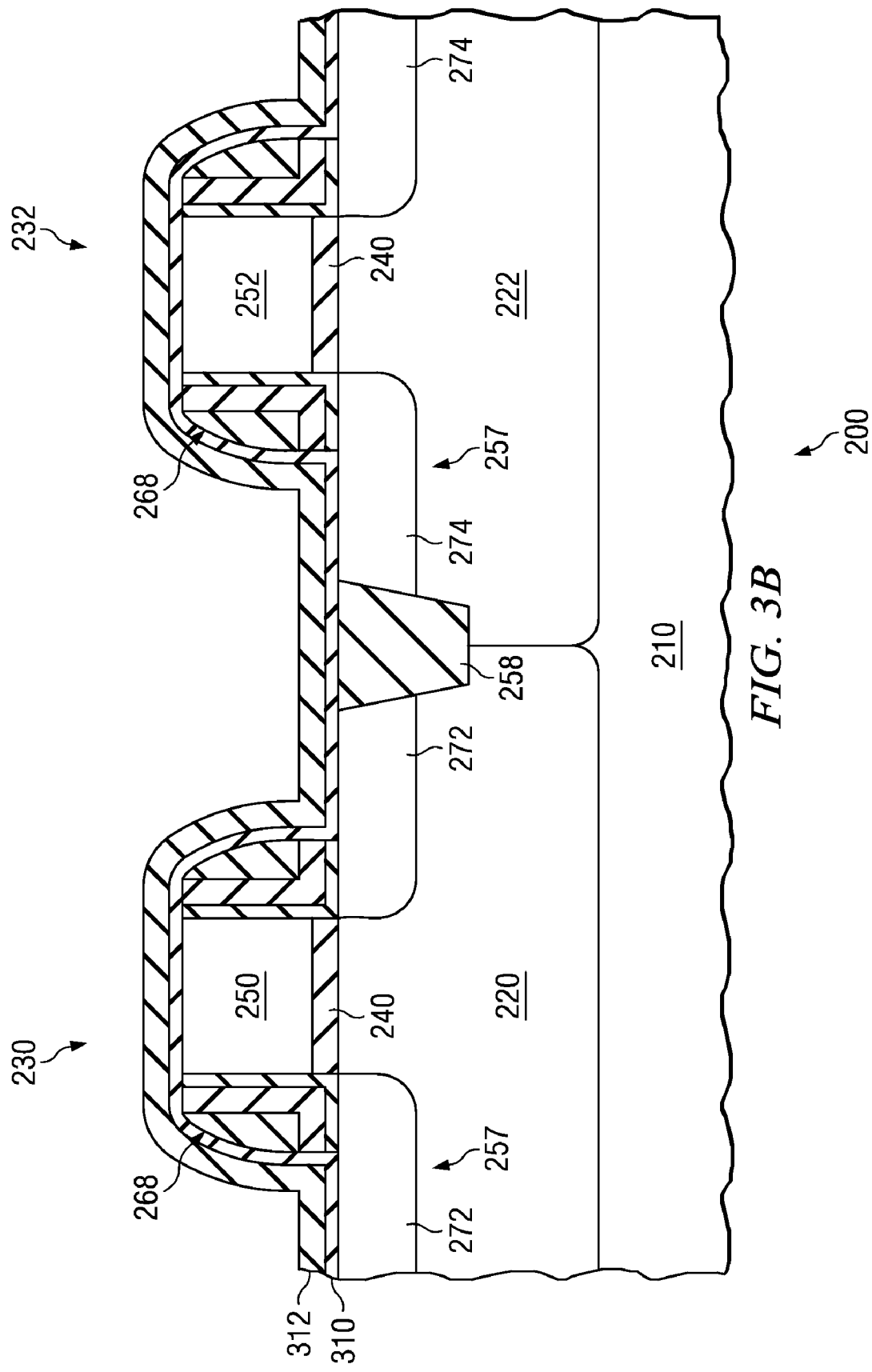

FIG. 3B illustrates the semiconductor device 200 of FIG. 3A following the deposition of a protective layer 312 over the capping layer 310. The protective layer 312 may be a single layer or multiple layers that are capable of protecting the source/drains 272, 274 during a gate dopant implantation process and may be used in conjunction with other underlying layers, such as the capping layer 310 to protect those regions during those processes. The protective layer 312, in one embodiment, comprises nitride or oxide with an exemplary material being silicon nitride or silicon oxynitride. However, other well-known materials, such as organic-based photoresists or spin-on-glass materials may also be used. Conventional deposition processes, such as chemical vapor deposition, physical vapor deposition, atomic layer deposition or spin-on processes may be used to deposit the protective layer 312. The thickness of the protective layer 312 may range from about 5 nm to about 40 nm, with 15 nm being the thickness in one particular embodiment. As shown in the embodiment illustrated in FIG. 3B, the protective layer 312 is conformally deposited over both gate electrodes 250, 252 and the source/drains 272, 274.

Figure 3C:
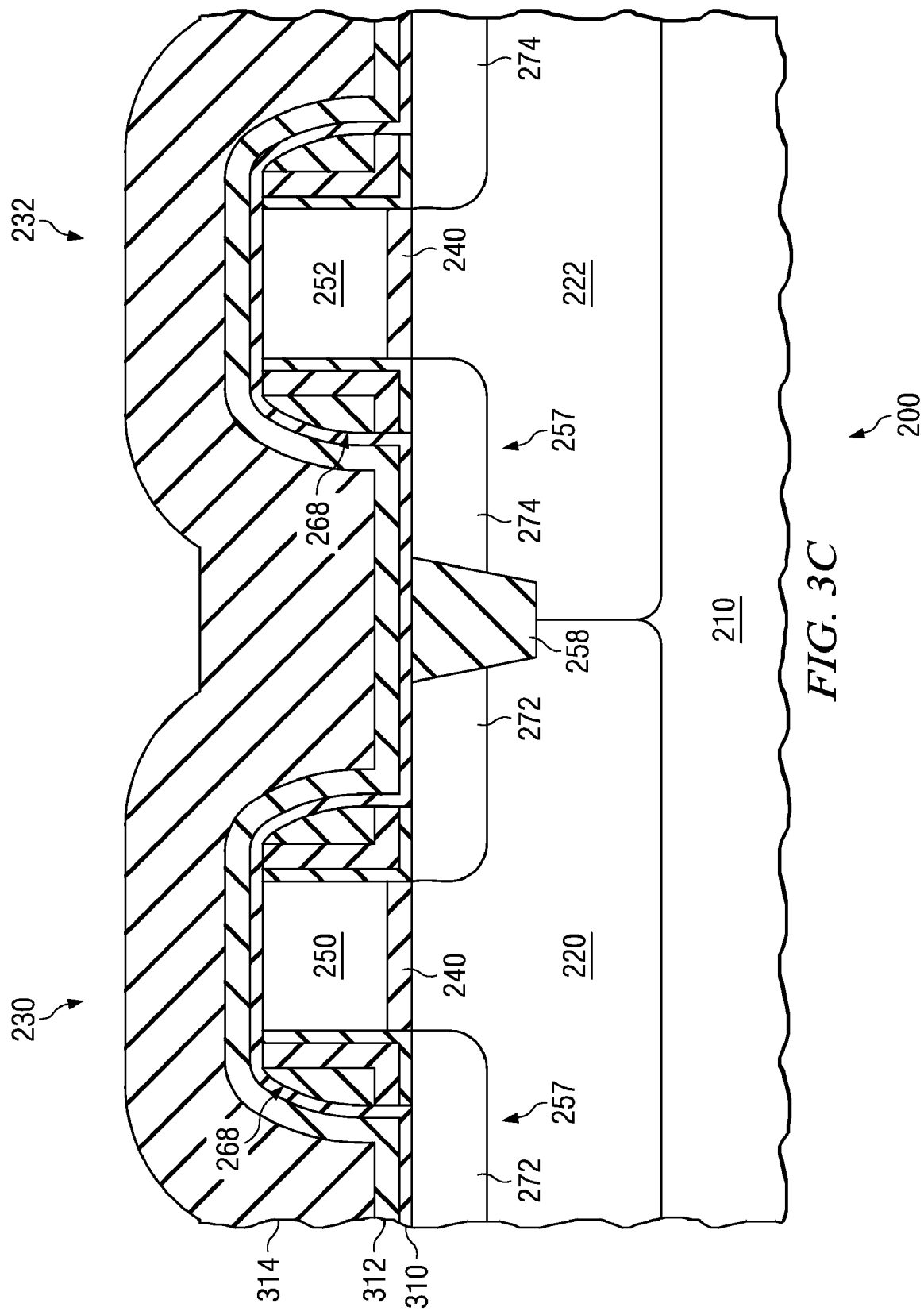

FIG. 3C illustrates the semiconductor device 200 of FIG. 3B following the deposition of a CMP layer 314 over the protective layer 312. The term "CMP" with respect to the CMP layer 314 is not limited to a layer that can be removed only by a chemical/mechanical polishing process. Instead, it refers to a layer that can be removed by various processes, such as by chemical/mechanical processes, or etch processes, such as chemical etches, or physical etches, such as plasma etches or ion beam processes, etc. In one embodiment, the CMP layer may be a dielectric layer, such as silicon dioxide. Conventional deposition processes, such as chemical vapor deposition or physical vapor deposition, may be used to deposit the CMP layer 314. In one embodiment, the CMP layer 314 is tetra orthosilicate (TEOS), and the thickness of the CMP layer 314 may vary with a one embodiment having a thickness of about 200 nm. As shown in the embodiment of FIG. 3C, the CMP layer 314 is conformally deposited over the protective layer 312, including both gate electrodes 250, 252 and the source/drains 272, 274. The CMP layer 314 provides a barrier that allows for its controlled removal over the gate electrodes 250, 252. In one embodiment, the CMP layer 314 may be removed with a conventional CMP process, but in other embodiments, it may be removed with conventional wet or dry etch processes. Additionally, as discussed below, the CMP layer 314 inhibits the removal of the protective layer 312 located over the source/drains 272, 274 during an etch process that is conducted to remove a portion of the protective layer 312 located over each of the gate electrodes 250, 252.

Figure 4A:
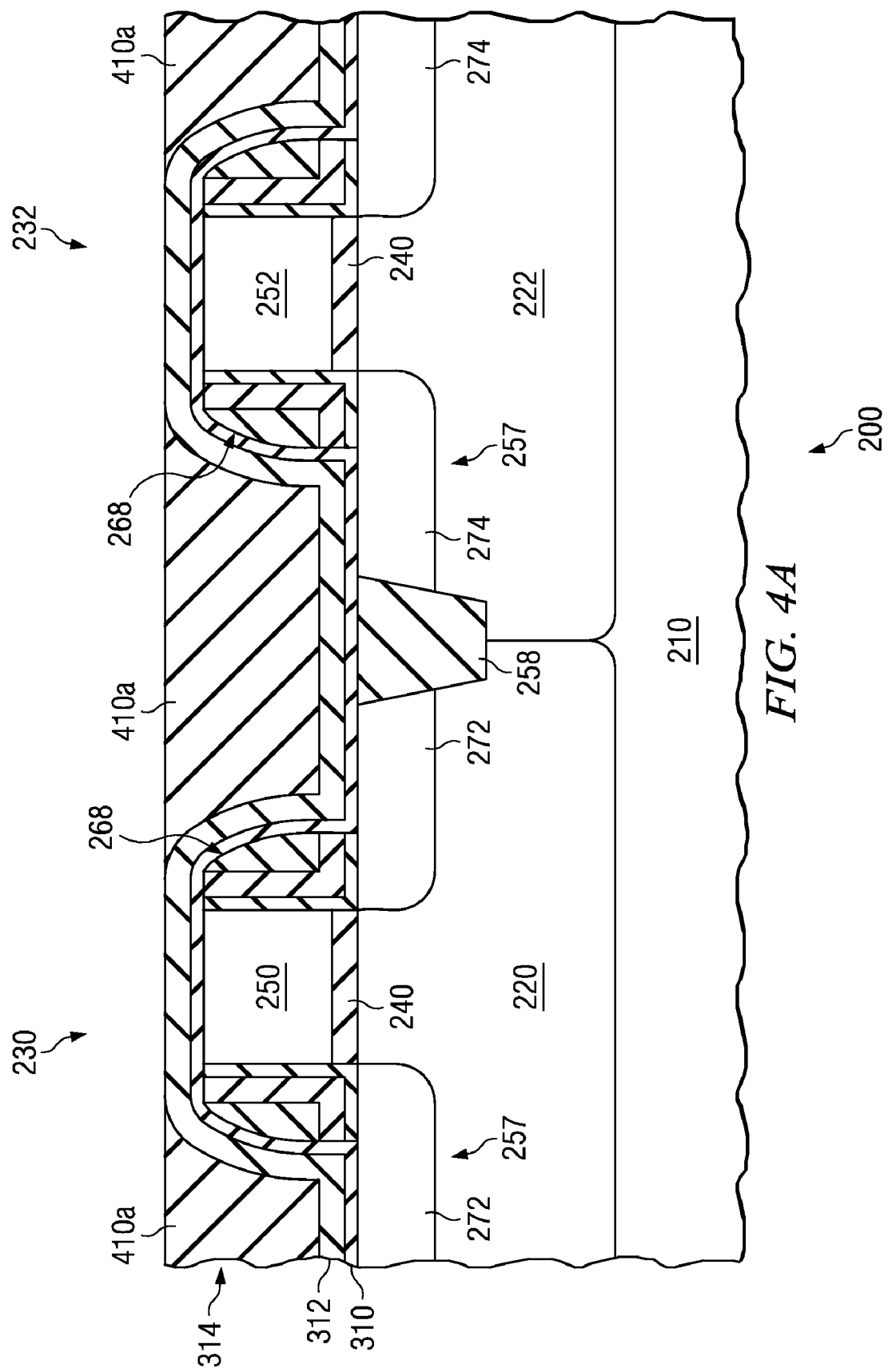
FIGS. 4A-4D illustrate stages wherein the layers of FIG. 2E are removed and gate electrodes are doped.

FIG. 4A illustrates the semiconductor device 200 of FIG. 3C following a partial removal of the CMP layer 314. The CMP layer 314 is removed to expose the underlying protective layer 312 that is substantially located over the gate electrodes 250, 252. This partial removal exposes a portion of the protective layer 312 that is located over the gate electrodes 250, 252 so that it can be removed by a subsequent process. In certain embodiments, portions 410a of the CMP layer 314 may remain over the source/drains 272, 274. The presence of the remaining portions 410a prevents or limits unwanted removal of the protective layer 312 overlying these regions during subsequent processing steps. The CMP layer 314 may be removed using any conventional process. For example, a CMP process may be used to remove the CMP layer 314 down to and substantially stopping on the protective layer 312. While a small portion (less than 2 nm) of the protective layer 312 may be removed during this process, it remains substantially intact.

Figure 4B:
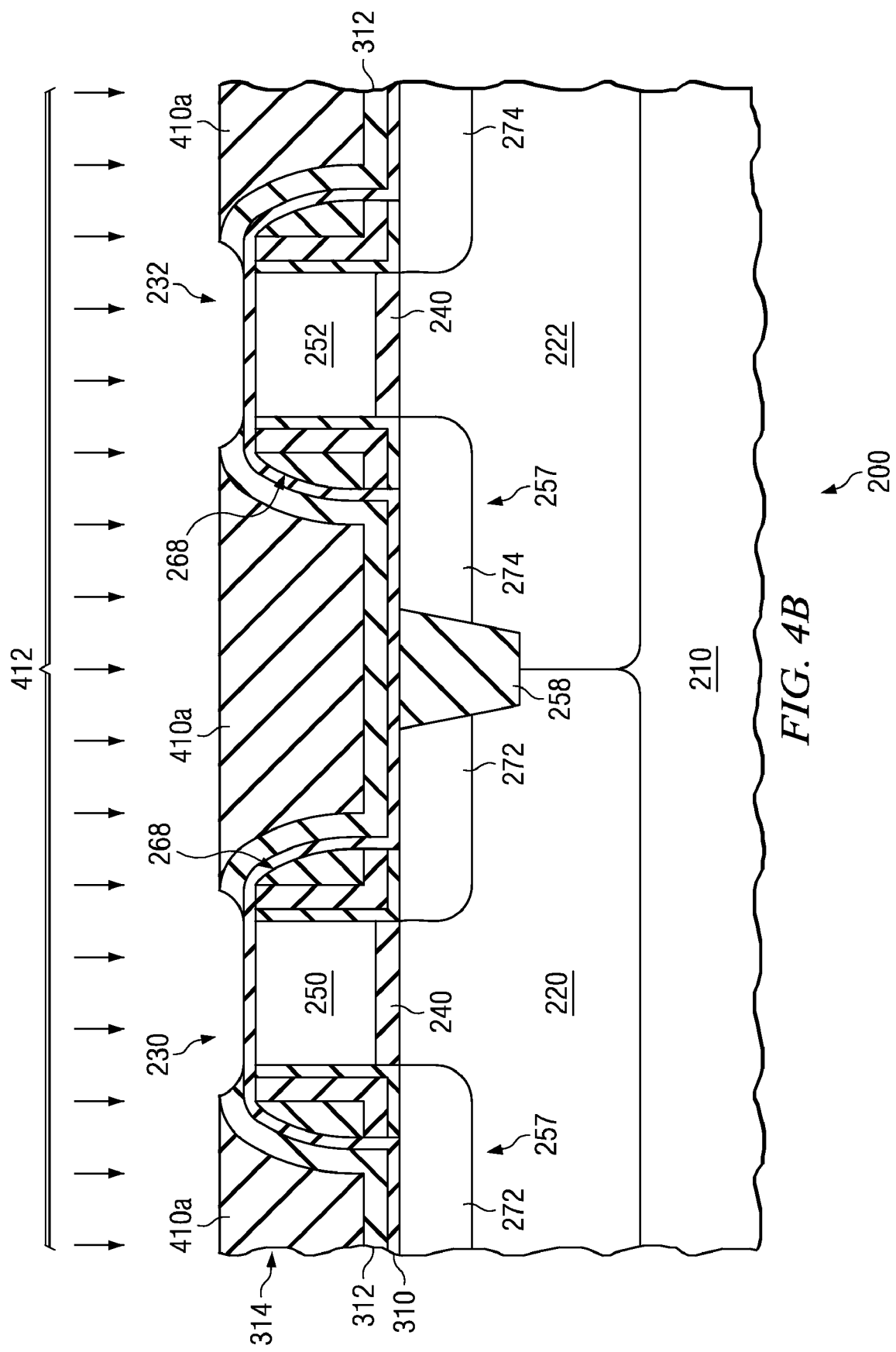

FIG. 4B illustrates the semiconductor device 200 of FIG. 4A following the removal of a portion of the protective layer 312. In one embodiment, an etch 412 is conducted to remove a portion of the protective layer 312 that overlies the gate electrodes 250, 252. The etch chemistry will vary depending on the type of material from which the protective layer 312 is comprised. For example, in those embodiments where the protective layer 312 is comprised of a nitride material, the etch may be a dry nitride etch. In one aspect of this particular embodiment, the dry nitride etch comprises a mixture of gases. For example, the gas mixture may be a mixture of difluoromethane flowed at about 85 sccm, oxygen flowed at about 13 sccm, argon flowed at about 47 sccm and methane flowed at about 28 sccm. The etch rate in one exemplary embodiment is about 1200 A/min with selectivity to the gate electrode etch rate of about 24. The chuck temperature may vary depending on the tool with about 65 degrees Celsius being an exemplary temperature. In another embodiment, the etch may be a wet etch, such as a hot phosphoric acid etch. In such embodiments, the hot phosphoric acid etch is conducted at a temperature of about 160 degrees Celsius. It should be understood that the foregoing is given as an example only and that other removal techniques, such as reactive ion etching, may also be employed to remove the portion of the protective layer 312.

In one aspect, the chosen removal process may be selective to the CMP layer 314 and the capping layer 310; that is the selected etch or other removal technique should remove the protective layer 312 at a much higher rate than the surrounding materials. Since the etch is selective to the surrounding materials, only small amounts of the CMP layer 314 and the capping layer 310 will be removed at this point in the process. In the embodiment illustrated in FIG. 4B, the etch 412 removes the protective layer 312 to expose the capping layer 310 that is located over the top portion of the gate electrodes 250, 252. However, the gate electrodes 250, 252 are substantially unaffected by the etch 412 because a substantial portion of the capping layer 310 remains during the etch 412 to protect the gate electrodes 250, 252 from the effects of the etch process. In some instances, the gate electrodes 250, 252 may be susceptible to the etch 412. Thus, the capping layer 310 advantageously prevents the etch 412 from affecting the gate electrodes 250, 252.

Figure 4C:
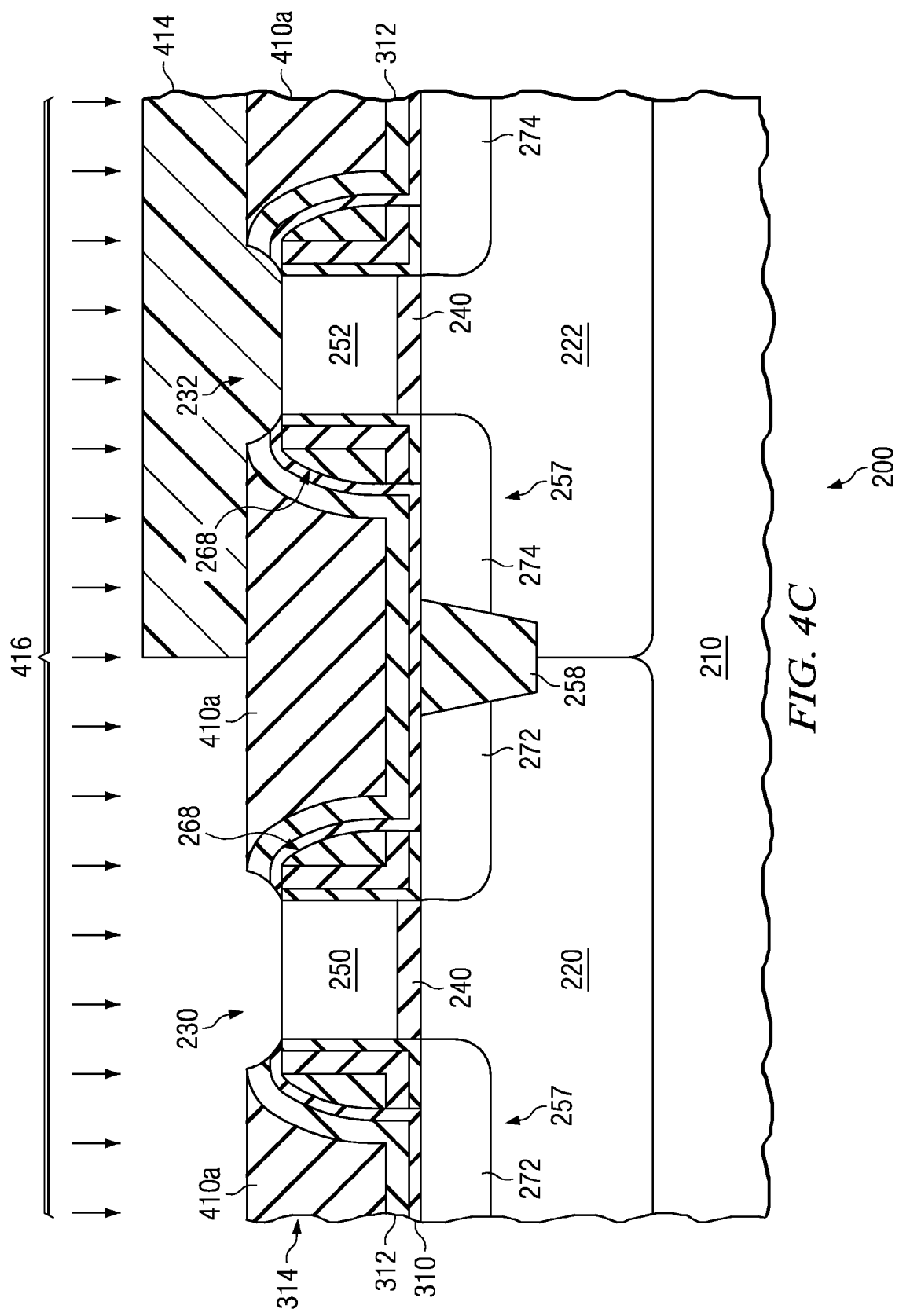

FIG. 4C illustrates the semiconductor device 200 of FIG. 4B following the removal of a portion of the capping layer 310 located over the gate electrodes 250, 252 and the deposition and patterning of a masking layer 414. In one embodiment, an etch is conducted to remove a portion of the capping layer 310 that overlies the gate electrodes 250, 252. The etch chemistry may be conventional and can vary depending on the type of material comprising the capping layer 310. For example, in those embodiments where the capping layer 310 is comprised of silicon dioxide, the etch may be a conventional hydrofluoric etch. It should be understood that the foregoing is exemplary only and that other removal techniques, such as reactive ion etching may also be employed in removing the portion of the capping layer 310. In this aspect, the chosen removal process will be selective to the protective layer 312 and the gate electrodes 250, 252; that is, the selected etch or other removal technique should remove the capping layer 310 at a much higher rate than either of the protective layer 312 or the gate electrodes 250, 252. Moreover, the etch is preferably selective to the gate electrodes 250, 252 and will, therefore, have little affect on them. Since the etch is selective to the surrounding materials, only small amounts of the protective layer 312 or the gate electrodes 250, 252 are removed at this point in the process. As seen, the etch removes the cap layer 310 to expose the upper surface of the gate electrodes 250, 252 but the protective layer 312 and the capping layer 310 located over the source/drains 272, 274 remain in place.

FIG. 4C further illustrates the device 200 undergoing a doping process 416 after the mask layer 414 is patterned. In this view, the gate electrode 250 is exposed to the doping process 416. For example, in FIG. 4C, the gate electrode 250 may be implanted with an n-type dopant to form an NMOS device. Because only the gate electrode 250 is exposed, a maximum dopant dosage may be used. This is beneficial over conventional processes, where the gate electrode is often doped with the source/drain doping process, which limits the amount of dopants that are placed in the gate electrode. Since the doping of the gate electrode 250 is decoupled from the doping of the source/drains 272, more dopant can be placed into the gate electrode 250, which can increase device performance. Further, because of this decoupling, different types of dopants can be used to dope the gate electrode 250 as compared to the source/drains 272. For example, if gate electrode 250 is an NMOS gate, phosphorous can be used to dope the gate electrode 250 and arsenic can be used to dope the source/drains 272. This provides the benefit of greater flexibility and tailoring of the device 200. Moreover, since the gate electrode 250 is doped after being patterned, the gate length difference between NMOS and PMOS electrodes can be reduced as compared to conventional processes where the gates are doped prior to patterning.

In one embodiment where the gate electrode 250 is to be an NMOS gate electrode, the doping process 416 doping includes implanting an n-type dopant, such as arsenic or phosphorous, at an implant power ranging from about 5 to about 50 keV and at a dosage concentration ranging from about 1E14 atoms/cm$^2$ to about 1E16 atoms/cm$^2$. The specific energy and the dosage should be selected to maximize the amount of active dopant, thereby providing as robust a device as possible.

Figure 4D:
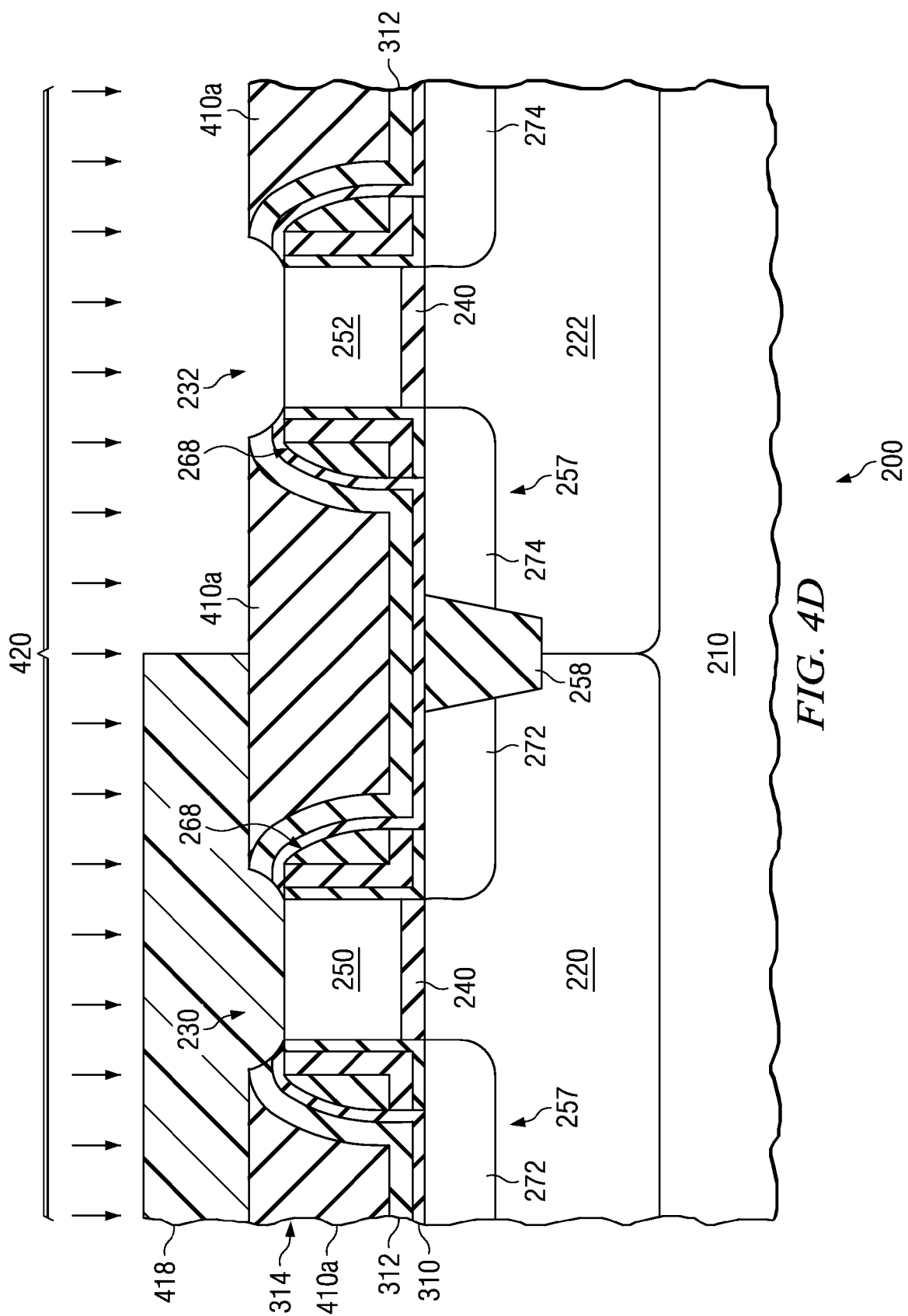

FIG. 4D illustrates the semiconductor device 200 of FIG. 4C following the removal of a portion of the capping layer 310 located over the gate electrodes 250, 252, as explained above, the doping of gate electrode 250, and the deposition and patterning of a masking layer 418. In this view, the gate electrode 255 is exposed to a doping process 420. For example, in FIG. 4D, the gate electrode 255 may be implanted with a p-type dopant to form a PMOS device. Because only the gate electrode 255 is exposed, a maximum dopant dosage may be used. This is beneficial for the same reason stated above regarding FIG. 4C. Since the doping of the gate electrode 255 is decoupled from the doping of the source/drains 274, more dopant can be placed into the gate electrode 255, which can increase device performance. Moreover, since the gate electrode 255 is doped after being patterned, the gate length difference between NMOS and PMOS electrodes can be reduced as compared to conventional processes where the gates are doped prior to patterning.

In one embodiment where the gate electrode 255 is to be a PMOS gate electrode, the doping process 420 doping includes implanting a p-type dopant, such as boron, at an implant power ranging from about 2 to about 5 keV and at a dosage concentration ranging from about 1E4 atoms/cm$^2$ to about 1E16 atoms/cm$^2$.

Though the embodiments discussed above are directed toward embodiments where both types of gate electrodes are doped, it should be understood that in other embodiments only one of the different types of gate electrodes may be doped using the processes discussed herein. Alternatively, these processes may be used to dope any number of the same type of gate electrodes, depending on the doping patterns that are used.

As mentioned above, another embodiment provides that the source/drains 272, 274 are not formed until after the gate electrodes 250, 252 are doped. In such embodiments, the same process steps as those described above may be used to dope the gate electrodes 250, 252, with the exception that the source/drains 272, 274 are not doped at the point of manufacture as discussed above. The extensions 255, 256, however, will have been formed as discussed above. After the gate electrodes 250, 252 are doped, conventional masking steps may be taken to cover the PMOS devices when NMOS doping is conducted and to cover the NMOS devices when PMOS doping is conducted. The doped gate electrodes 250, 252 may or may not be covered with the mask. However, in one embodiment, the respective gate electrodes 250, 252 are exposed during the respective source/drain doping process. In such instances, the NMOS gate electrode can receive an additional doping of an n-type dopant, and the PMOS gate electrode can receive and additional doping of a p-type dopant, thereby further increasing conductivity and device performance.

Figure 5:
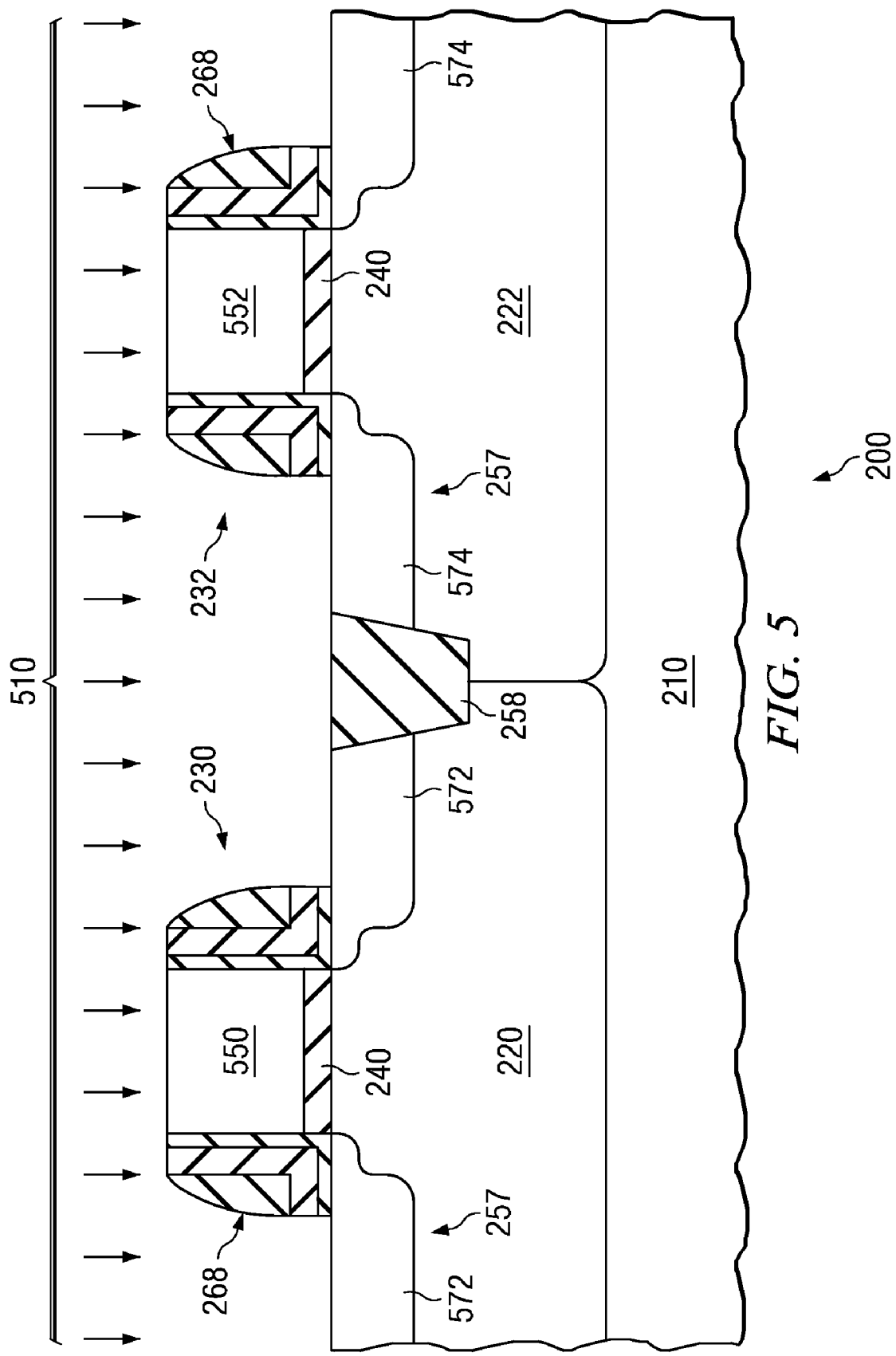
FIGS. 5-6 illustrate removal of remaining portions of the layers of FIG. 2E and formation of silicide contacts.

FIG. 5 illustrates the semiconductor device 200 of FIG. 4D after additional manufacturing steps. In this embodiment, the mask 418 is removed. Additionally, remaining portions of the CMP layer 410a, the protective layer 312 and cap layer 310 are removed. Conventional processes may be used to remove the remaining portions of these layers. Following the removal of these layers, an anneal 510 may be conducted to activate the dopants and form activated gate electrodes 550, 552 and source/drains 572 and 574. As mentioned above, in another embodiment, the dopants in the source/drains 272, 274 may have been activated by an anneal prior to doping the gate electrodes 550, 552. In one embodiment, the anneal may be conducted at a temperature ranging from about 1000° C. to about 1100° C. and a time period ranging from about 1 second to about 5 seconds. It should be noted that other temperatures, times, and processes could be used to activate the source/drains 272, 274 and the gate electrodes 550, 552

Figure 6:
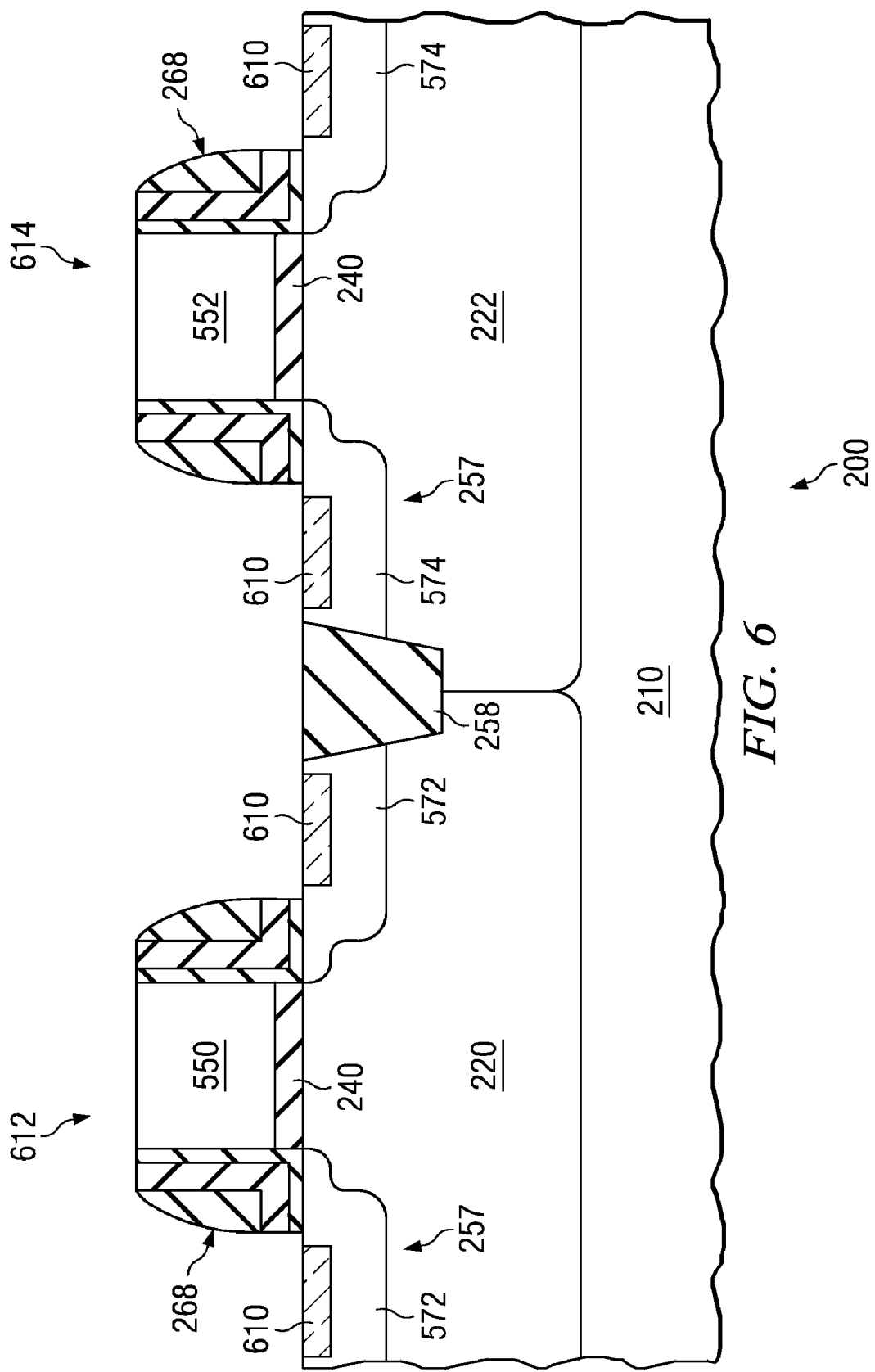

FIG. 6 illustrates the semiconductor device 200 of FIG. 5 after formation of silicided contact pads 610, which forms transistors 612, 614. Conventional processes may be used to form the silicide contact pads 610.

Figure 7:
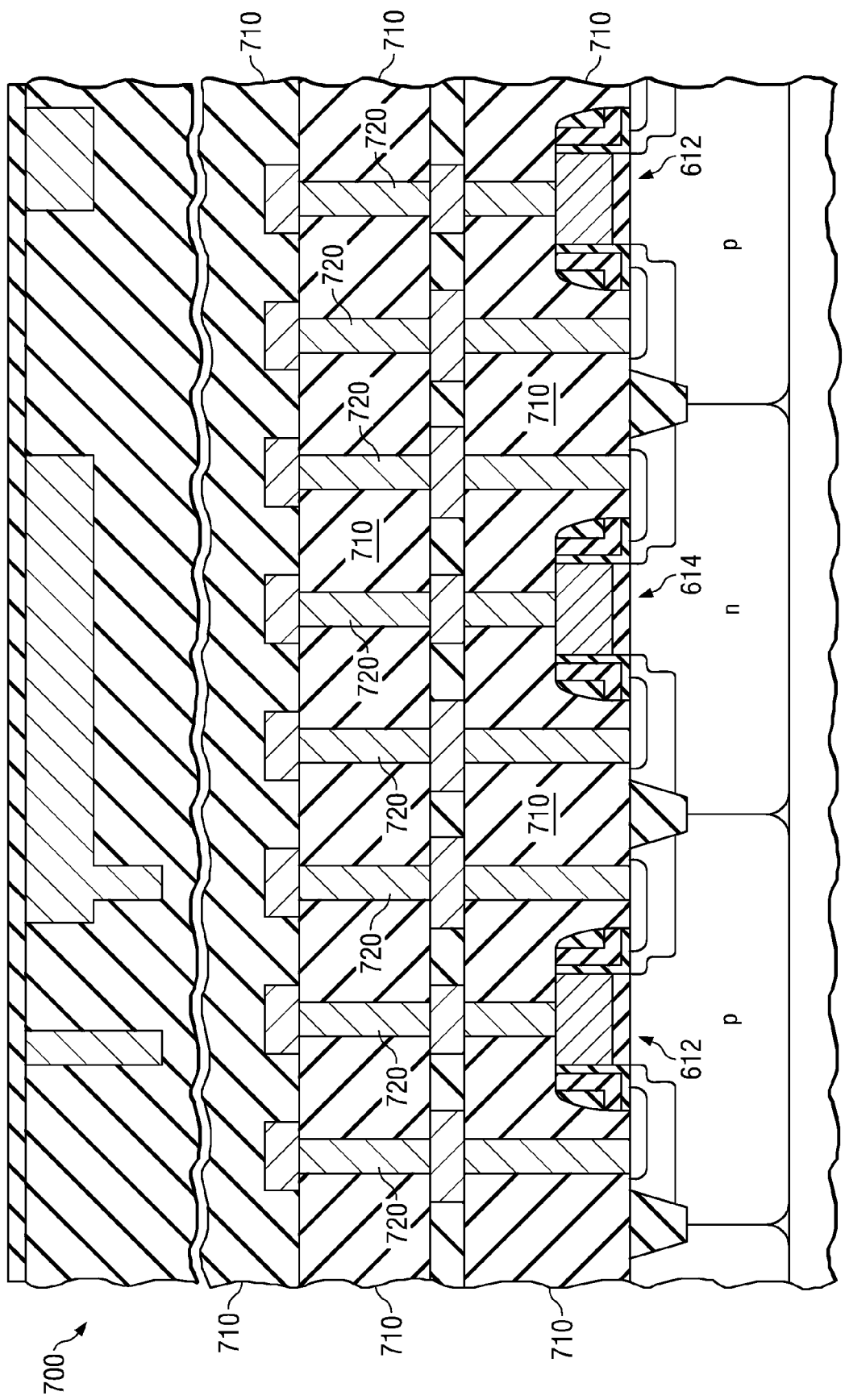
FIG. 7 illustrates a semiconductor device configured as an IC into which the device of FIG. 6 may be incorporated.

FIG. 7 illustrates the transistors 612, 614 of FIG. 6 incorporated into an integrated circuit (IC) 700. In the illustrated embodiments, the IC 700 includes complementary NMOS transistors 612 and PMOS transistor 614, which may be manufactured as discussed above. Overlying the transistors 612, 614 are dielectric layers 710 that may be conventionally formed, and interconnects 720 that are located over and within the dielectric layer 710. The interconnects 720 may be also be conventional and may include damascene or dual damascene structures, both of which are shown for illustrative purposes.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
    forming an NMOS gate structure and a PMOS gate structure over a semiconductor substrate, the NMOS and PMOS gate structures including respective patterned NMOS and PMOS polysilicon gate electrodes, and the semiconductor substrate including respective NMOS and PMOS source/drain regions adjacent the NMOS and PMOS gate structures;
    forming a protective layer over the NMOS and PMOS source/drain regions and over the NMOS and PMOS gate structures;
    forming a chemical/mechanical polishing (CMP) layer over the protective layer, over the NMOS and PMOS source/drain regions and over the NMOS and PMOS gate structures;
    using chemical/mechanical polishing, removing a portion of the CMP layer down to a portion of the protective layer over the NMOS and PMOS gate structures;
    etching the portion of the protective layer over the NMOS and PMOS gate structures to expose portions of the NMOS and PMOS gate electrodes, leaving remaining portions of the CMP layer and the protective layer over the NMOS and PMOS source/drain regions and over other portions of the NMOS and PMOS gate electrodes;
    following the etching, forming and patterning a first mask over the remaining portions of the CMP layer and the protective layer to leave exposed the exposed portion of one of the NMOS and PMOS gate electrodes, and to cover the exposed portion of the other of the other of the NMOS and PMOS gate electrodes;
    in a first implant through the patterned first mask, doping the exposed portion of the one of the NMOS and PMOS gate electrodes;
    following the first implant, forming and patterning a second mask over the remaining portions of the CMP layer and the protective layer to leave exposed the exposed portion of the other of the NMOS and PMOS gate electrodes, and to cover the exposed portion of the one of the NMOS and PMOS gate electrodes; and
    in a second implant through the patterned second mask, doping the exposed portion of the other of the NMOS and PMOS gate electrodes.

2. The method recited in claim 1, wherein the protective layer comprises silicon nitride or silicon oxynitride.

3. A method of manufacturing a semiconductor device, comprising:
    forming gate structures over NMOS and PMOS transistor regions on a substrate, each gate structure including a patterned polysilicon gate electrode;
    forming sidewall spacers adjacent to the gate structures, the transistor regions including source/drain regions adjacent the sidewall spacers;
    depositing an oxide capping layer over the gate structures, the sidewall spacers and the source/drain regions of the NMOS and PMOS transistor regions;

depositing a protective layer over the oxide capping layer, over the gate structures, the sidewall spacers and the source/drain regions of the NMOS and PMOS transistor regions;

depositing a chemical/mechanical polishing (CMP) layer over the protective layer, over the gate structures, the sidewall spacers and the source/drain regions of the NMOS and PMOS transistor regions;

removing portions of the CMP layer, the protective layer and the oxide capping layer overlying the gate electrodes to expose upper parts of the gate electrodes, leaving remaining portions of the CMP layer, the protective layer and the oxide capping layer covering the source/drain regions;

with the remaining portions covering the source/drain regions and the upper parts of the gate electrodes in the NMOS transistor regions exposed, masking to prevent implanting into the exposed upper parts of the gate electrodes in the PMOS transistor regions, and performing a first implant with an n-type dopant into the exposed upper parts of the gate electrodes in the NMOS transistor regions;

with the remaining portions covering the source/drain regions and the upper parts of the gate electrodes in the PMOS transistor regions exposed, masking to prevent implanting into the exposed upper parts of the gate electrodes in the NMOS transistor regions, and performing a second implant with a p-type dopant into the exposed upper parts of the gate electrodes in the PMOS transistor regions; and either before or after the first and second implants, with the source/drain regions uncovered by the CMP layer, the protective layer and the oxide capping layer, performing other implants to respectively dope the NMOS and PMOS transistor source/drain regions.

4. The method recited in claim 3, wherein the other implants are performed before the first and second implants.

5. The method recited in claim 4, wherein the other implants provide additional doping of the gate electrodes.

6. The method recited in claim 3, wherein the other implants provide additional doping of the gate electrodes.

7. The method recited in claim 1, further comprising, following the first and second implants, forming at least one dielectric layer over the substrate with interconnects therein.

8. The method recited in claim 1, further comprising, following the first and second implants, forming a plurality of dielectric layers over the substrate with horizontal and vertical interconnects therein.

9. The method recited in claim 1, further comprising, in a third implant, doping one of the NMOS and PMOS source/drain regions with no part of the CMP layer and no part of the protective layer over the one of the NMOS and PMOS source/drain regions.

10. The method recited in claim 9, wherein the third implant also includes doping a corresponding one of the NMOS and PMOS gate electrodes with no part of the CMP layer and no part of the protective layer over the corresponding one of the NMOS and PMOS gate electrodes.

11. The method recited in claim 10, wherein the third implant occurs prior to formation of the protective layer.

12. The method recited in claim 3, wherein forming the sidewall spacers comprises:
    forming a first oxide layer over the gate structures;
    forming a silicon nitride layer over the oxide layer over the gate structures;
    forming a second oxide layer over the silicon nitride layer; and
    patterning the first oxide layer, the silicon nitride layer and the second oxide layer to form sidewall spacers on the gate structures.

13. The method recited in claim 3, further comprising, after performing the first and second implants, removing remaining portions of the CMP layer, the protective layer and the oxide capping layer.

14. The method recited in claim 3, further comprising, after performing the first and second implants and after performing the other implants, performing an activation anneal to activate dopant implanted in the source/drain regions.

* * * * *